(12) United States Patent
Corrado et al.

(10) Patent No.: US 7,653,499 B2
(45) Date of Patent: Jan. 26, 2010

(54) METHOD AND SYSTEM FOR AUTOMATED ENERGY USAGE MONITORING WITHIN A DATA CENTER

(75) Inventors: Ronald P. Corrado, Wappingers Falls, NY (US); Madhusudan K. Iyengar, Woodstock, NY (US); Jeffrey A. Newcomer, Poughkeepsie, NY (US); Roger R. Schmidt, Poughkeepsie, NY (US); Gerard V. Weber, Saugerties, NY (US)

(73) Assignee: International Business Machines Corporation, Armonk, NY (US)

( * ) Notice: Subject to any disclaimer, the term of this patent is extended or adjusted under 35 U.S.C. 154(b) by 19 days.

(21) Appl. No.: 11/956,405

(22) Filed: Dec. 14, 2007

(65) Prior Publication Data
US 2009/0157333 A1 Jun. 18, 2009

(51) Int. Cl.
*G01R 21/00* (2006.01)
(52) U.S. Cl. ............... 702/61; 702/60; 702/62; 702/64; 702/65
(58) Field of Classification Search ......... 702/60–62, 702/64–65, 130, 132, 136, 182–183, 186–188; 361/678, 679.49, 696, 690; 236/13
See application file for complete search history.

(56) References Cited

U.S. PATENT DOCUMENTS

| 5,115,967 A | * | 5/1992 | Wedekind | 236/46 R |
| 5,647,225 A | * | 7/1997 | Fischer et al. | 62/434 |
| 2003/0115000 A1 | * | 6/2003 | Bodas | 702/60 |
| 2003/0193777 A1 | * | 10/2003 | Friedrich et al. | 361/687 |
| 2004/0139038 A1 | * | 7/2004 | Ehlers et al. | 705/412 |
| 2007/0043478 A1 | * | 2/2007 | Ehlers et al. | 700/276 |
| 2007/0276547 A1 | * | 11/2007 | Miller | 700/295 |

* cited by examiner

*Primary Examiner*—Eliseo Ramos Feliciano
*Assistant Examiner*—Mi'schita' Henson
(74) *Attorney, Agent, or Firm*—Geraldine Monteleone, Esq.; Kevin P. Radigan, Esq.; Heslin Rothenberg Farley & Mesiti P.C.

(57) ABSTRACT

An automated method and system are provided for facilitating monitoring of energy usage within a data center. The method includes automatically determining energy usage of one or more electronics racks of a data center by automatically ascertaining time-based energy usage of the electronics racks. The automatically ascertaining includes obtaining multiple measurements of instantaneous energy usage by each of the electronics racks in the data center over a period of time, and then separately averaging the multiple measurements for each electronics rack to obtain the time-based energy usage of each electronics racks. The method also includes outputting the time-based energy usage of the electronic(s) racks to facilitate monitoring of the data center.

20 Claims, 12 Drawing Sheets

METHOD AND SYSTEM FOR AUTOMATED ENERGY USAGE MONITORING WITHIN A DATA CENTER

TECHNICAL FIELD

The present invention relates in general to computer room or data center monitoring and management, and more particularly, to a method and system for automated energy usage monitoring of, for example, electronics racks and computer room air-conditioning units within a data center.

BACKGROUND OF THE INVENTION

As is well known, as the circuit density of electronic chip devices increases in order to achieve faster and faster processing speeds, there is a corresponding demand for circuit devices to be packed more closely together, and for the circuits themselves to be operated at increasingly higher clock speeds. Each new generation of computers continues to offer increased speed and function. In most cases, this has been accomplished by a combination of increased power dissipation and increased packaging density. The net result has been increased circuit density at all levels of packaging, including at the electronics rack level.

SUMMARY OF THE INVENTION

Within this environment, disclosed herein (in one aspect) is a method of facilitating monitoring a data center which includes: automatically determining energy usage of at least one electronics rack of the data center, the automatically determining including automatically ascertaining time-based energy usage of the at least one electronics rack, wherein the automatically ascertaining comprises obtaining multiple measurements of instantaneous energy usage of the at least one electronics rack over a period of time, and averaging the multiple measurements to obtain the time-based energy usage of the at least one electronics rack; and outputting the time-based energy usage of the at least one electronics rack to facilitate monitoring of the data center.

In another aspect, a system for monitoring a data center is provided. The system includes at least one rack monitor unit associated with at least one electronics rack of the data center for monitoring energy use thereof, and at least one instantaneous rack power measurement component. The at least one instantaneous rack power measurement component is associated with the at least one electronics rack of the data center, and each instantaneous rack power measurement component is coupled to a respective rack monitor unit of the at least one rack monitor unit. The at least one rack monitor unit automatically determines energy usage of the associated at least one electronics rack by automatically ascertaining time-based energy usage of the at least one electronics rack employing the at least one instantaneous rack power measurement component. The automatically ascertaining includes obtaining multiple measurements of instantaneous energy usage of the associated at least one electronics rack over a period of time, and averaging the multiple measurements to obtain the time-based energy usage of the associated at least one electronics rack. The at least one rack monitor unit further outputs the time-based energy usage of the associated at least one electronics rack to facilitate monitoring of the data center.

In a further aspect, a data center is provided which includes at least one electronics rack, and a system for monitoring energy usage of the at least one electronics rack. The system includes at least one rack monitor unit associated with the at least one electronics rack of the data center for monitoring energy use thereof, and at least one instantaneous rack power measurement component. The at least one instantaneous rack power measurement component is associated with the at least one electronics rack of the data center, and each instantaneous rack power measurement component is coupled to a respective rack monitor unit of the at least one rack monitor unit. The at least one rack monitor unit automatically determines energy usage of the associated at least one electronics rack by automatically ascertaining time-based energy usage of the at least one electronics rack employing the at least one instantaneous rack power measurement component. The automatically ascertaining includes obtaining multiple measurements of instantaneous energy usage of the associated at least one electronics rack over a period of time, and averaging the multiple measurements to obtain the time-based energy usage of the associated at least one electronics rack. The at least one rack monitor unit further outputs the time-based energy usage of the associated at least one electronics rack to facilitate monitoring of the data center.

Further, additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION OF THE INVENTION

As used herein, the terms "electronics rack", "rack-mounted electronic equipment", and "rack unit" are used interchangeably, and unless otherwise specified include any housing, frame, rack, compartment, blade server system, etc., having one or more heat generating components of a computer system or electronics system, and may be, for example, a stand alone computer processor having high, mid or low end processing capability. An electronics rack comprises at least one electronics subsystem. "Electronics subsystem" refers to any sub-housing, blade, book, drawer, node, compartment, etc., having one or more heat generating electronic components disposed therein. Each electronics subsystem of an electronics rack may be movable or fixed relative to the rack unit, with the electronics drawers of a multi-drawer rack unit and blades of a blade center system being two examples of electronics subsystems of an electronics rack to be cooled. In addition, "data center" refers to a computer installation to contain one or more electronics racks to be cooled. As a specific example, a data center may be designed to contain one or more rows of rack-mounted electronic equipment, such as server units.

Reference is made below to the drawings, which are not drawn to scale for reasons of understanding, wherein the same reference numbers used throughout different figures designate the same or similar components.

Figure 1:
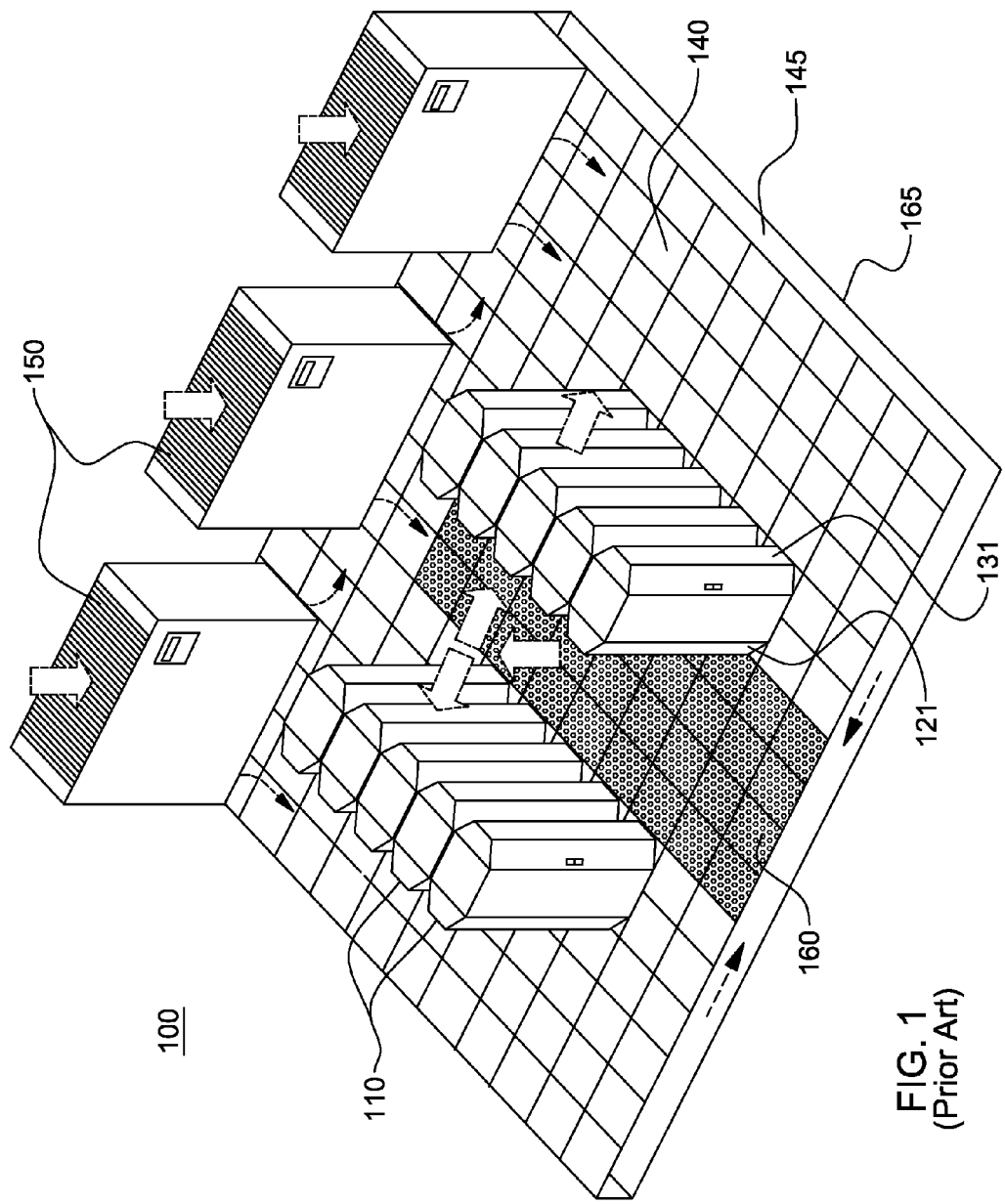
FIG. 1 depicts one embodiment of a conventional raised floor layout of an air-cooled data center.

As shown in FIG. 1, in a raised floor layout of an air cooled computer installation or data center 100 typical in the prior art, multiple electronics racks 110 are disposed in one or more rows. A computer installation such as depicted in FIG. 1 may house several hundred, or even several thousand microprocessors. In the arrangement of FIG. 1, chilled air enters the computer room via floor vents from a supply air plenum 145 defined between the raised floor 140 and a base or sub-floor 165 of the room. Cooled air is taken in through louvered air inlet doors 121 of the electronics racks and expelled through louvered air outlet doors 131 of the electronics racks. Each electronics rack 110 may have an air moving device (e.g., fan or blower) to provide forced inlet-to-outlet air flow to cool the electronic components within the electronics subsystem(s) of the rack. The supply air plenum 145 provides conditioned and cooled air to the air inlet sides of the electronics racks via perforated floor tiles 160 disposed in a "cold" air aisle of the data center. The conditioned and cooled air is supplied to plenum 145 by one or more conditioned air units 150, also disposed within data center 100. Room air is taken into each conditioned air unit 150 near an upper portion thereof. This room air comprises in part exhausted air from the "hot" air aisles of the data center disposed adjacent to air outlet sides of the electronics racks 110.

The increased circuit density at all levels of packaging, including the electronics rack level, has resulted in a growing energy usage concern. Traditionally, energy usage within a data center is not readily available. As described below, this deficiency is addressed by the methods and systems presented herein which automatically monitor energy usage within a data center at various levels of the data center. Both historic and current energy use, energy cost and cooling energy efficiency data may be automatically generated and output as desired.

Figure 2:
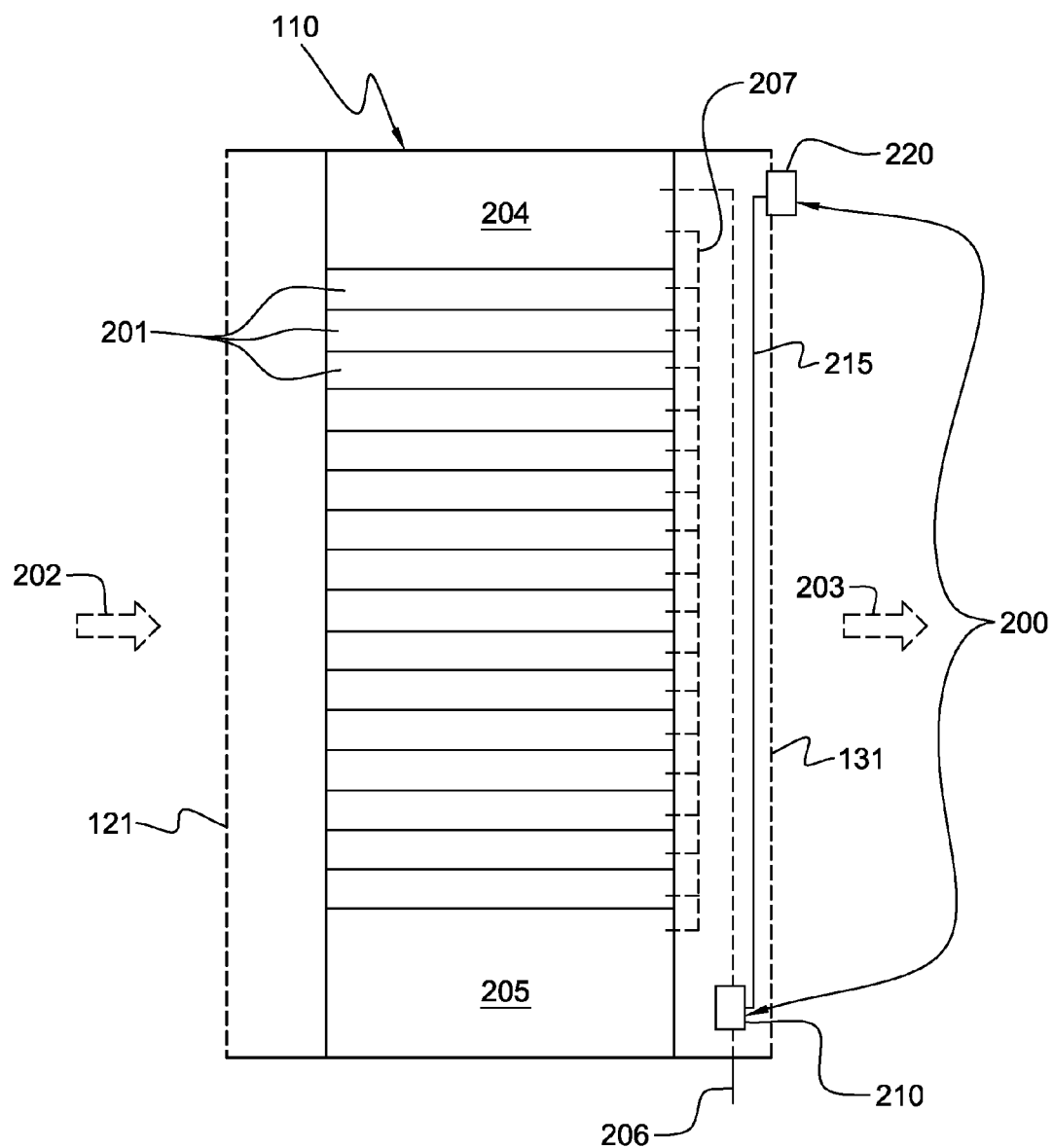
FIG. 2 is a cross-sectional elevational view of one embodiment of an electronics rack and a rack energy usage monitoring system, in accordance with an aspect of the present invention.

FIG. 2 is an elevational view of one embodiment of an electronics rack 110 and a rack energy usage monitoring system 200, in accordance with an aspect of the present invention. Electronics rack 110 includes a plurality of electronics subsystems 201 which, in the embodiment illustrated, are air-cooled by cool air 202 ingressing via louvered air inlet door 121, and exhausting out louvered air outlet door 131 as hot air 203. Electronics rack 110 further includes a rack power supply 204 and, in one embodiment, a switch network 205. An AC power supply cable 206 feeds power to rack power supply 204 which transforms the supplied power to an appropriate DC power level for output via distribution cable 207 to the plurality of electronics subsystems 201 and switch network 205.

Rack energy usage monitoring system 200 includes, in one embodiment, a power measurement instrumentation 210, such as a wattmeter, for measuring power passing through power supply cable 206. By way of example, power measurement instrumentation 220 may comprise a digital wattmeter connected to each AC input phase line of AC power supply cable 206 (e.g., two phases for U.S. 208 $V_{rms}$, and single or three phases for international 415 $V_{rms}$). Within the digital wattmeter, a volt meter samples the instantaneous voltage across the phases at millisecond range intervals. A microcontroller averages the readings to calculate the rms voltage. Similarly, a current meter or magnetic probe in series with each phase samples the instantaneous current at millisecond range intervals. The readings are averaged to obtain the rms current $I_{rms}$. Average power is determined by multiplying $V_{rms}$ by $I_{rms}$. If desired, a custom power supply cable could be employed to accommodate the instrumentation for a new electronics rack design. For legacy designs, or when custom design is not feasible, a clamp-on and probe-based instrumentation can be utilized.

The monitoring system further includes a rack monitor unit 220, which is coupled via a data cable 215 to power measurement instrumentation 210 for receiving data on measured power usage of the electronics rack 110. In one embodiment, rack monitor unit 220 includes a display for visually displaying, for example, an instantaneous power usage reading as measured by power measurement instrumentation 210, or historical power usage data, such as time-based power usage of the electronics rack. The rack monitor unit 220 may be disposed in a readily visible location on the electronics rack 110, such as an upper portion of the louvered air outlet door 131 of the electronics rack.

Figure 3:
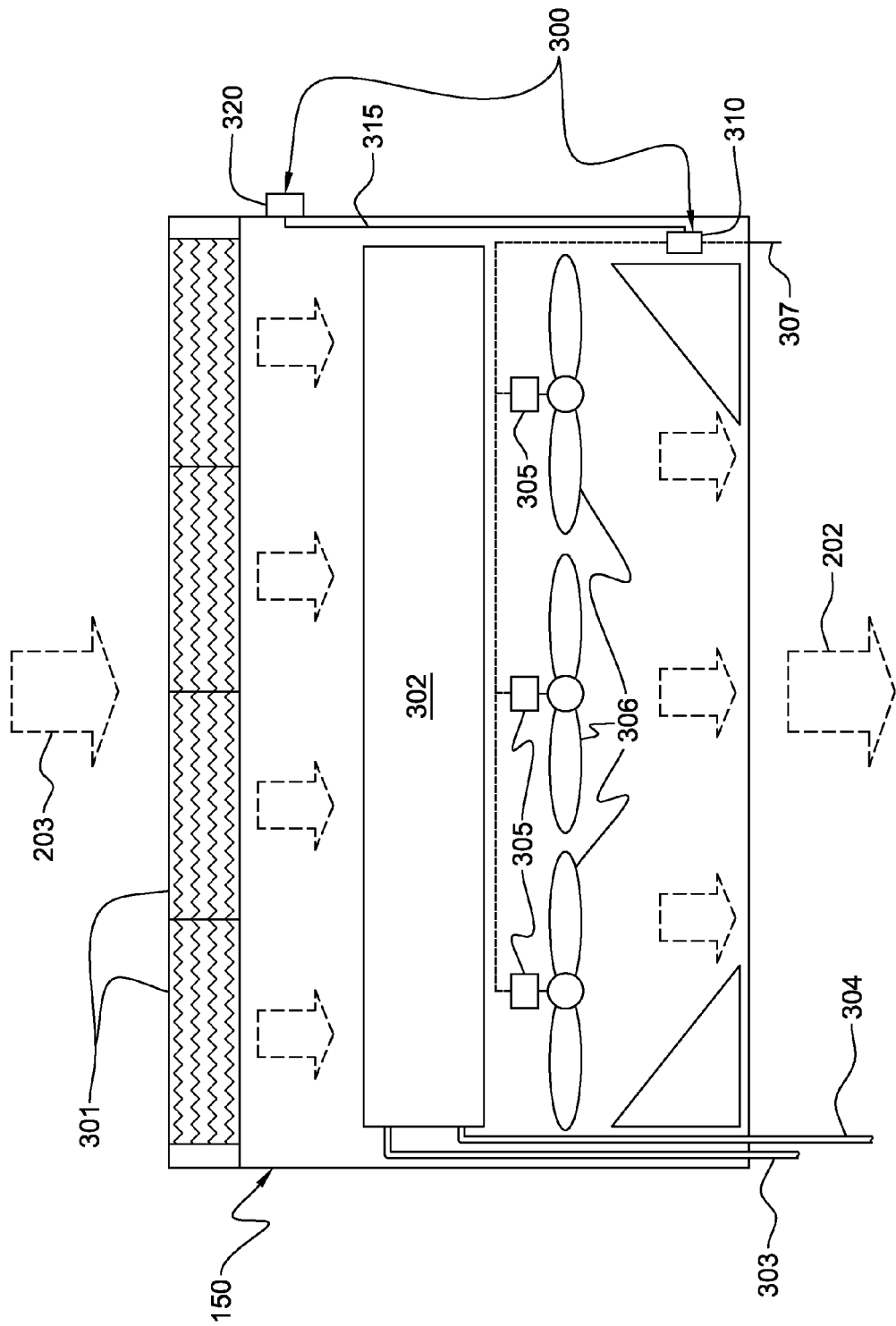
FIG. 3 is a cross-sectional elevational view of one embodiment of a computer room air-conditioning (CRAC) unit and a CRAC energy usage monitoring system, in accordance with an aspect of the present invention.

FIG. 3 depicts one embodiment of a computer room air-conditioning (CRAC) unit 150 and a CRAC energy usage monitoring system 300, in accordance with an aspect of the present invention. As illustrated, hot air 203 (e.g., from the air outlet sides of the electronics racks within the data center) is drawn in through air filters 301 disposed at an upper portion of CRAC unit 150. After conditioning, the hot air is drawn through an air-to-liquid heat exchanger 302 which cools the air employing chilled facility coolant supplied, for example, via facility supply line 303, and exhausted via facility return line 304. Cooled air 202 is exhausted from CRAC unit 150 by one or more air-moving devices 306, each in this example, having an associated electrically driven motor 305. This cooled air 202 is distributed (in the example of FIG. 1) to the under-floor plenum of the raised floor data center for distribution to the cold air aisles of the data center.

The CRAC energy usage monitoring system includes a power measurement instrumentation 310 and a CRAC monitor unit 320. Power measurement instrumentation 310 measures power provided through power supply cable 307 to motors 305 (driving air-moving devices 306). In one example, power measurement instrumentation 310 is a wattmeter, which is coupled via a data cable 315 to CRAC monitor unit 320 for providing measured values of electrical power consumed by the CRAC unit. CRAC monitor unit 320 may be disposed, for example, on a visible side of CRAC unit 150 and include a display for visually displaying, for example, instantaneous power usage of the CRAC unit, as well as historical, time-based power usage of the CRAC unit.

Figure 4:
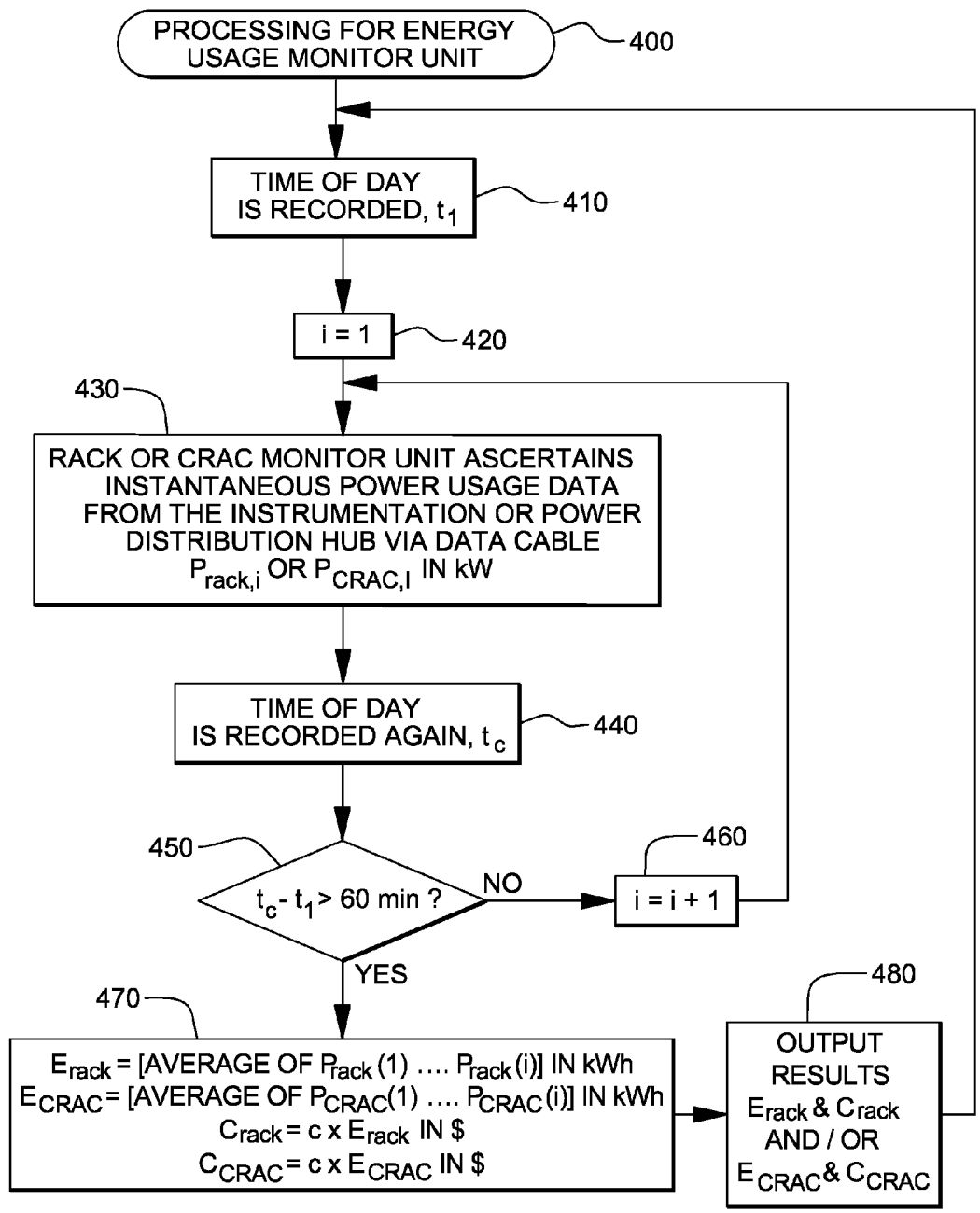
FIG. 4 is a flowchart of one embodiment of processing of the rack monitor unit of the rack energy usage monitoring system of FIG. 2 and the air-conditioning monitor unit of CRAC energy usage monitoring system of FIG. 3, in accordance with an aspect of the present invention.

FIG. 4 is a flowchart of one embodiment of processing implemented within the rack monitor unit of the rack energy usage monitoring system of FIG. 2 and/or the CRAC monitor unit of the CRAC energy usage monitoring system of FIG. 3. Alternatively, a centralized zonal or data center based monitor unit (see FIGS. 5 & 6) may be employed, with data cables 215, 315 (see FIGS. 2 & 3) providing the centralized monitor unit with instantaneous power measurements from the respective power measurement instrumentations, to implement the processing of FIG. 4. In the discussion which follows, it is assumed that the rack monitor units and CRAC monitor units each implement the relevant portions of the processing flow.

As shown, the processing for energy usage monitor unit 400 begins with recording the time of day $t_1$ 410, and setting a count variable i to "1" 420. The variables employed in the flowchart of FIG. 4 are defined in Table 1 below.

The rack or CRAC monitor unit next ascertains instantaneous power usage data from, for example, the power measurement instrumentation or alternatively from a power distribution hub (e.g, at the rack power supply, or individual electronics subsystems) via an appropriate data cable 430. Instantaneous power measurements may be obtained via the network from a centralized cluster control unit, which can be a personal computer located at a local or remote location. The personal computer may use existing software such as IBM's PowerExecutive™ program to ascertain instantaneous electronics rack power information.

The instantaneous power usage data for the electronics rack is represented as $P_{rack, i}$, while the instantaneous power usage data for the CRAC unit is represented as $P_{CRAC, i}$, both (for example) in kilowatts (or watts). Thereafter, the current time of day is recorded $t_c$ 440 and processing determines whether the difference between the current time and the initial time $t_1$ is greater than 60 minutes 450. If "no", then the variable i is incremented and another set of instantaneous power usage data measurements are ascertained for, for example, one or more electronics racks and/or one or more CRAC units within the data center. Once the difference between the current recorded time $t_c$ less the initial recorded time $t_1$ is greater than 60 minutes, then processing automatically separately averages the multiple measurements obtained for each of the electronics rack or for the CRAC unit to obtain a time-based energy usage of the one or more electronics racks or one or more CRAC units 470.

In one example, the time-based energy usage of the electronics rack(s) ($E_{rack}$) is expressed in kilowatt hours, as is the time-based energy usage of the CRAC unit(s) ($E_{CRAC}$). Additionally, the time-based cost of energy consumed by the electronics rack ($C_{rack}$) can be determined by multiplying energy cost per kilowatt hour by the time-based energy usage of the electronics rack, and the time-based cost of energy consumed by the CRAC unit ($C_{CRAC}$) is similarly determined by multiplying the actual cost per kilowatt hour of energy by the time-based energy usage of the CRAC unit. After quantifying the time-based energy usage of the electronics rack or time-based energy usage of the CRAC unit, and optionally, the time-based cost of energy consumed by the electronics rack or time-based cost of energy consumed by the CRAC unit, the results are output 480. By way of example, outputting may comprise displaying, printing or recording the results to facilitate monitoring of the data center.

TABLE 1

| Variable | Definition |
|---|---|
| $t_1$ | Initial time (in minutes or seconds). |
| $P_{rack, i}$ | Instantaneous rack power usage data (kW). |
| $P_{CRAC, i}$ | Instantaneous power usage data for CRAC unit (kW). |
| $t_C$ | Current time instantaneous power usage data is recorded (in minutes). |
| $E_{rack}$ | Time-based energy usage of electronics rack (expressed as kWh). |
| $E_{CRAC}$ | Time-based energy usage of CRAC unit (expressed in kWh). |
| c | Local cost of energy in $/kWh |
| $C_{rack}$ | Time-based cost of energy consumed by the electronics rack (e.g., dollar cost of energy used in one hour). |
| $C_{CRAC}$ | Time-based cost of energy consumed by the CRAC unit (e.g., dollar cost of energy used in one hour). |

Figure 5:
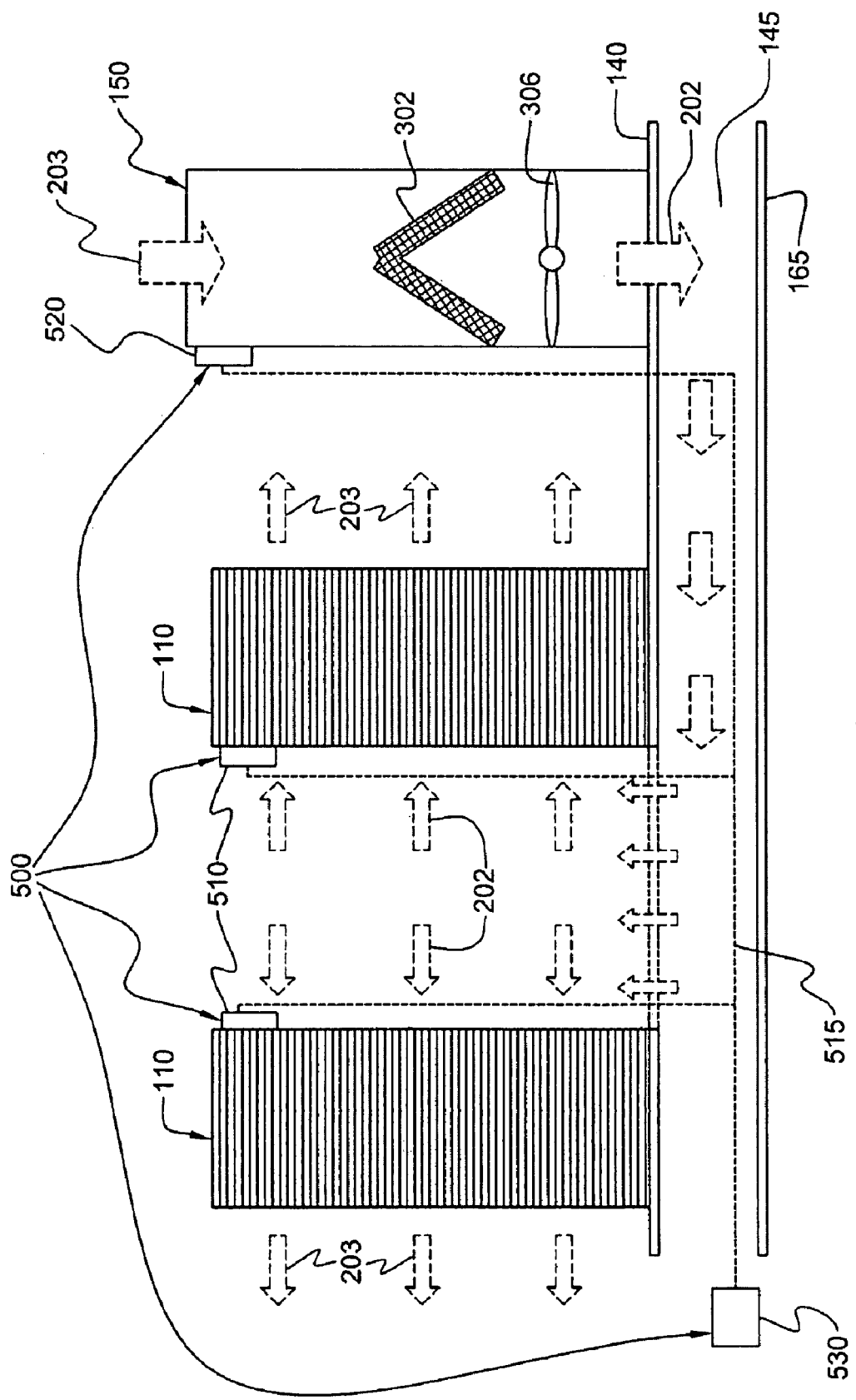
FIG. 5 is an elevational view of one embodiment of a zone level energy usage monitoring system for a data center, in accordance with an aspect of the present invention.

FIG. 5 depicts one embodiment of a raised floor data center and a zone level energy usage monitoring system, generally denoted 500, in accordance with an aspect of the present invention. Electronics racks 110 are arranged in a traditional cold air aisle, hot air aisle configuration, with the CRAC unit disposed close to one aisle comprising, for example, ten electronics racks. In practice, there could be more or less electronics racks in an aisle, and more than one CRAC unit servicing a particular aisle or group of electronics racks. Each aisle of electronics racks is considered, in one example, to be a zone, which has an energy consumption, an energy cost, and a cooling efficiency associated with it. In reality, the zones could have any rationale for classification. For example, zones could be identified based on type of electronics rack, spatial proximity of rack units, or the fact that certain electronics racks are running a common software job, or other similar reason.

As shown in FIG. 5, hot air 203 is drawn into CRAC unit 150, cooled by air-to-liquid heat exchanger 302, and pumped out via air-moving device 306 as cold air 202 into cold air plenum 145 disposed between raised floor 140 and base floor 165 of the data center. Cold air 202 is distributed by cold air plenum 145 to the cold air aisles of the zones for cooling electronics rack 110.

Zone energy usage monitoring system 500 includes rack monitor units 510, CRAC monitor unit 520 and a zone monitor unit 530. In one embodiment, zone monitor unit 530 is disposed remote from the zone of the data center, for example, at a centralized control unit for the data center. Alternatively, zone monitor unit 530 could be mounted on a structure within the zone of interest for visual display of the energy usage characteristics noted herein for that zone. A data cable 515 couples rack monitor units 510 and CRAC monitor unit 520 to zone monitor unit 530 for feeding accumulated energy usage data to the zone monitor unit. In this embodiment, it is assumed that instantaneous power measurements are obtained, for example, as described above in connection with FIGS. 2 & 3.

Figure 6:
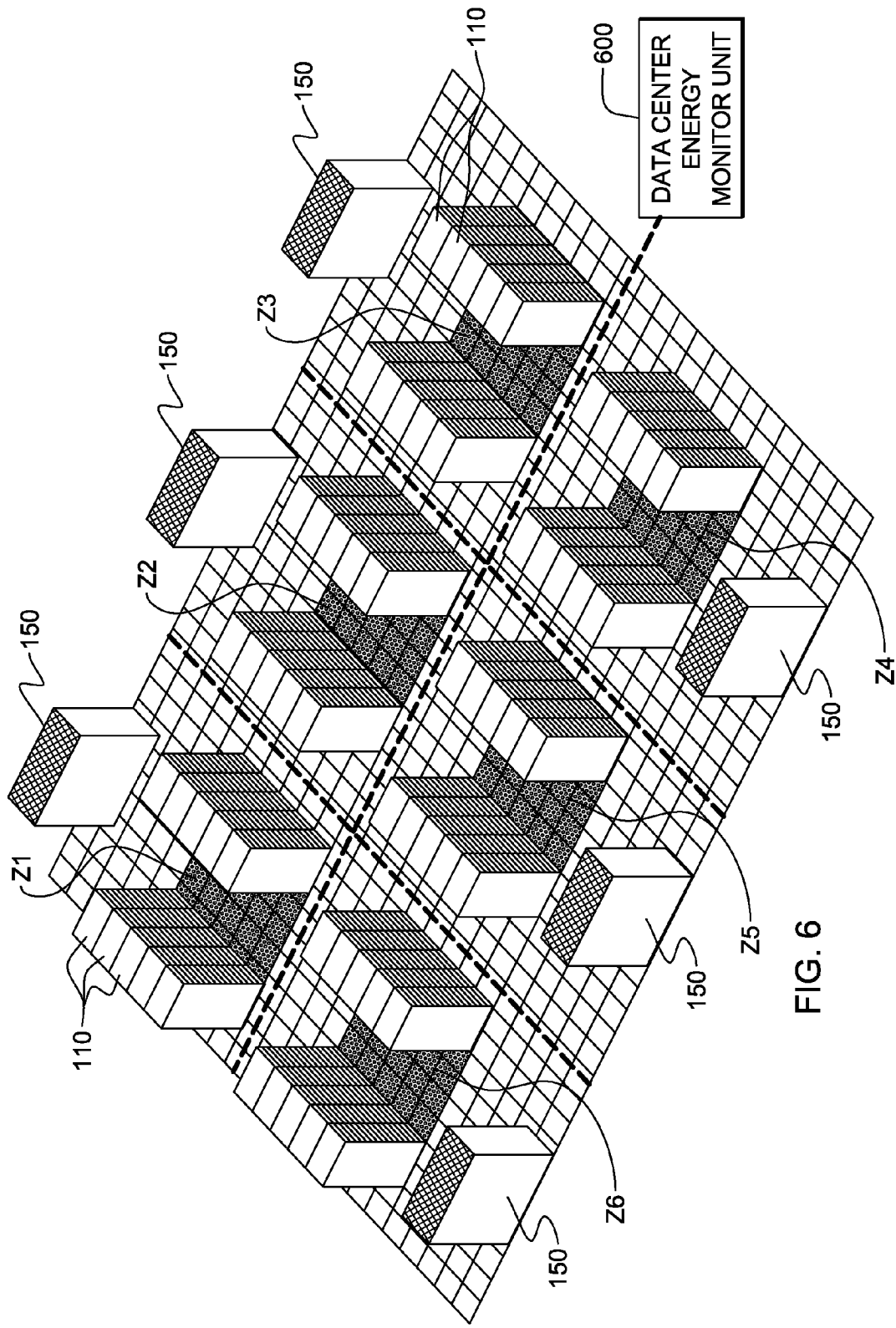
FIG. 6 is a perspective view of a data center divided into multiple energy usage monitoring zones, in accordance with an aspect of the present invention.

FIG. 6 depicts one embodiment of a data center divided into six zones, labeled Z1 . . . Z6. Within each zone, a cold air aisle is defined by two opposing rows of five electronics racks 110. Each zone has associated therewith a respective CRAC unit 150. A data center energy usage monitor unit 600 is coupled via one or more data cables to, for example, the zonal monitor units 530 (FIG. 5) of the respective zones Z1 . . . Z6. Data center energy usage monitor unit 600 aggregates and provides multiple energy usage characteristics for the data center, for example, at a rack level, CRAC level, zone level or data center level using the processing of FIGS. 4 & 7 (in one embodiment).

Figure 7:
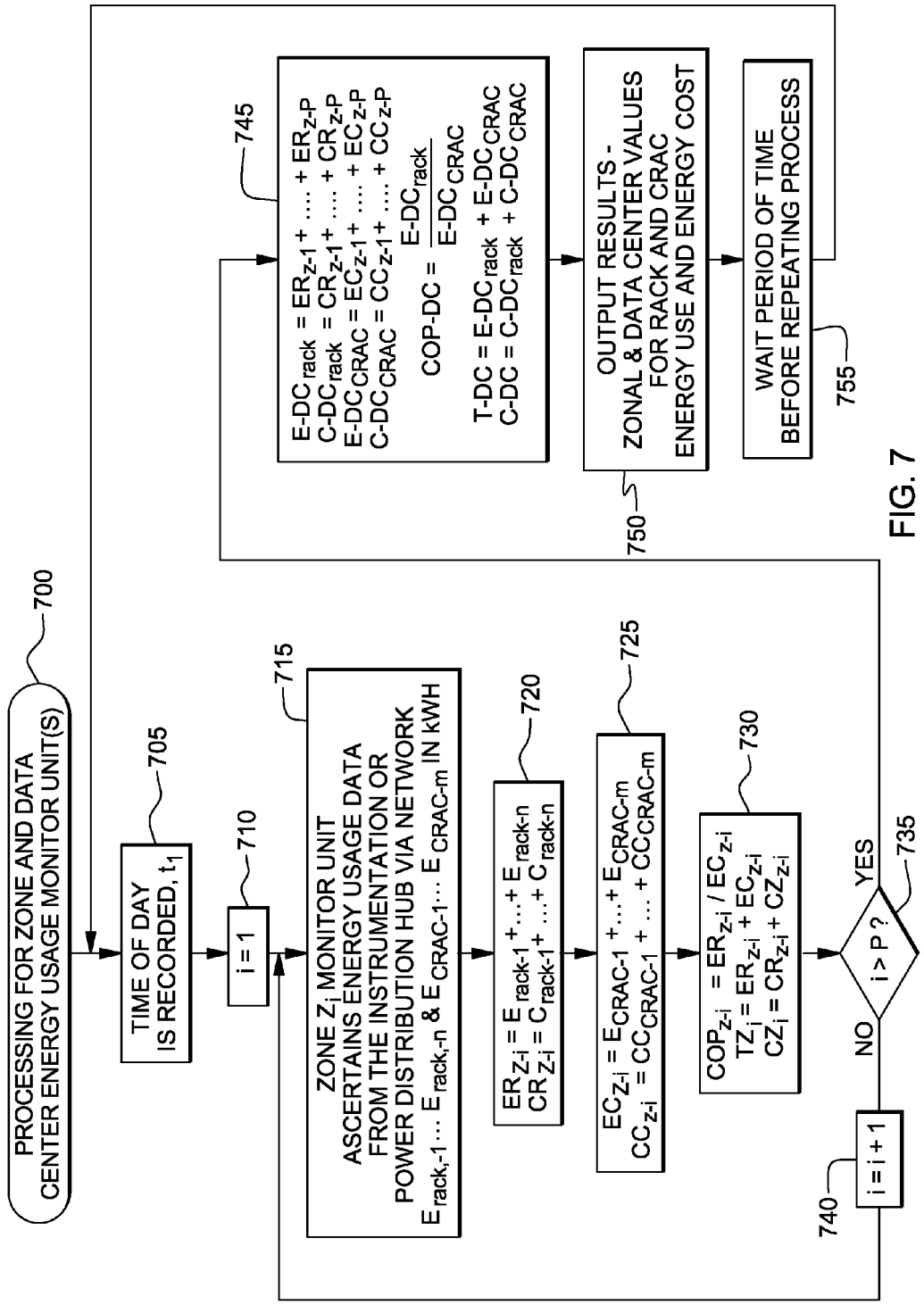
FIG. 7 is a flowchart of one embodiment of processing for monitoring energy usage within zones of the data center illustrated in FIG. 6, and for summing data center energy usage characteristics across the zones, in accordance with an aspect of the present invention.

FIG. 7 depicts one embodiment of processing for monitoring energy usage within zones of a data center, as well as for aggregating data center energy usage characteristics across zones, in accordance with an aspect of the present invention. The variables employed in FIG. 7 are defined in Table 2 below.

TABLE 2

| Variable | Definition |
|---|---|
| $Z_1 \ldots Z_p$ | Zone identifiers. |
| P | Total number of zones. |
| $ER_Z$ | Time-based electronics rack energy use by zone (kWh). |
| $CR_Z$ | Time-based electronics rack energy cost by zone ($). |
| $EC_Z$ | Time-based CRAC energy use by zone (kWh). |
| $CC_Z$ | Time-based CRAC energy cost by zone ($). |
| $COP_Z$ | The zonal time-based cooling energy efficiency expressed as a coefficient of performance ratio. |
| TZ | Total time-based zonal energy use (e.g., expressed as kWh). |
| CZ | Total time-based zonal cost of energy consumed (e.g., dollar cost of energy used in one hour). |
| $E\text{-}DC_{rack}$ | Time-based electronics rack energy use in the data center (kWh). |
| $C\text{-}DC_{rack}$ | Time-based electronics rack energy cost in the data center ($). |
| $E\text{-}DC_{CRAC}$ | Time-based CRAC energy use in the data center floor (kWh). |
| $C\text{-}DC_{CRAC}$ | Time-based cost of energy consumed by the CRAC unit(s) in the data center (e.g., dollar cost of energy used in one hour).. |
| COP-DC | The data center cooling energy efficiency expressed as a coefficient of performance ratio (e.g., time-based electronics rack energy used in data center to time-based CRAC energy used in data center). |
| T-DC | Total time-based data center energy use (e.g., expressed as kWh). |
| C-DC | Total time-based data center cost of energy consumed (e.g., dollar cost of energy used in one hour). |

Referring to FIG. 7, the processing implemented by zone and data center energy usage monitor units 700 begins with recording the time of day, $t_1$ 705, and setting of a variable i to "1" 710. Zone level processing includes, for zone $Z_i$, ascertaining energy usage data from the power measurement instrumentations 210, 310 of FIGS. 2 & 3 (or for the electronics racks, from power distribution hubs via the power distribution network) 715. The instantaneous energy usage measurements are obtained for each of n electronics racks in the zone ($E_{rack-1} \ldots E_{rack-n}$) and for each of m computer room air-conditioning units in the zone ($E_{CRAC-1} \ldots E_{CRAC-n}$) in kWh (wherein $n \geq 2$, and $m \geq 1$).

The total time-based energy usage for the n electronics racks in the zone are summed to obtain the total zonal energy usage of the electronics racks ($ER_{Z-i}$), and a similar summation is made for the time-based cost of energy consumed by the n electronics racks ($CR_{Z-i}$) 720. Similarly, the time-based energy usage of the m CRAC units in the zone ($EC_i$) is obtained by summing the individual time-based energy usage of the CRAC units in the zone ($E_{CRAC-1} + \ldots + E_{CRAC-m}$) and the time-based cost of energy consumed by the m CRAC units in the zone are summed to obtain the total time-based cost of energy consumed by the m CRAC units in the zone ($CC_{Z-i}$) 725. The zonal energy efficiency expressed as a coefficient of performance ratio ($COP_{Z-i}$) is determined by dividing the total time-based energy usage of the n electronics racks in the zone by the total time-based energy usage of the m CRAC units in the zone 730. Further, the total time-based energy usage in the zone ($TZ_i$) is obtained by summing the zonal energy usage of the electronics racks for that zone and the zonal energy usage of the CRAC units in that zone. Similarly, the time-based cost of energy consumed ($CZ_i$) for the zone is obtained by summing the time-based cost of energy consumed by the electronics racks in the zone and the time-based cost of energy consumed by the CRAC units in the zone.

Processing next determines whether the variable i is greater than P, wherein P is the number of zones defined in the data center. If "no", variable i is incremented 740 and the above-noted energy usage measurements are obtained for a next zone in the data center. Those skilled in the art should note that above-noted energy usage calculations can be carried out in parallel or series. If in parallel, multiple zone monitor units could be employed within the data center. If in series, a single data center energy usage monitor unit could be used to implement the processing.

Once energy usage characterizations for each zone have been carried out, data center level characteristics can be determined (in one embodiment) 745. For example, the time-based energy usage for the electronics racks within the data center ($E\text{-}DC_{rack}$) can be determined by summing the time-based energy usage for the electronics racks within the individual zones, the time-based cost of energy consumed by the electronics racks in the data center ($C\text{-}DC_{rack}$) is obtained by summing the time-based cost of energy consumed by the electronics racks in the respective zones, the time-based energy usage of the CRAC units in the data center ($E\text{-}DC_{CRAC}$) is obtained by summing the time-based energy usage of the CRAC units in the individual zones of the data center, the time-based cost of energy consumed by the CRAC units in the data center ($C\text{-}DC_{CRAC}$) is obtained by summing the individual time-based cost of energy consumed by the CRAC units in the respective zones of the data center, the coefficient of performance for the data center (COP-DC) is determined by ascertaining the ratio of the time-based energy usage of the electronics racks in the data center to the time-based energy usage of the CRAC units in the data center, the total time-based energy usage for the data center (T-DC) is obtained by summing the time-based energy usage of the electronics racks within the data center and the time-based energy usage of the CRAC units within the data center, and the time-based cost of energy consumed within the data center (C-DC) is obtained by summing the time-based cost of energy consumed by the electronics racks within the data center and the time-based cost of energy consumed by the CRAC units within the data center.

One or more of the data center energy usage characteristics may then be output as either zonal or data center values for, for example, the electronics racks and/or the CRAC units within the data center. These energy usage characteristics provide historical energy usage and energy cost information at different energy consumption levels within the data center 750. After outputting the results, processing waits a period of time (for example, one hour) before repeating the process 755.

Figure 8A:
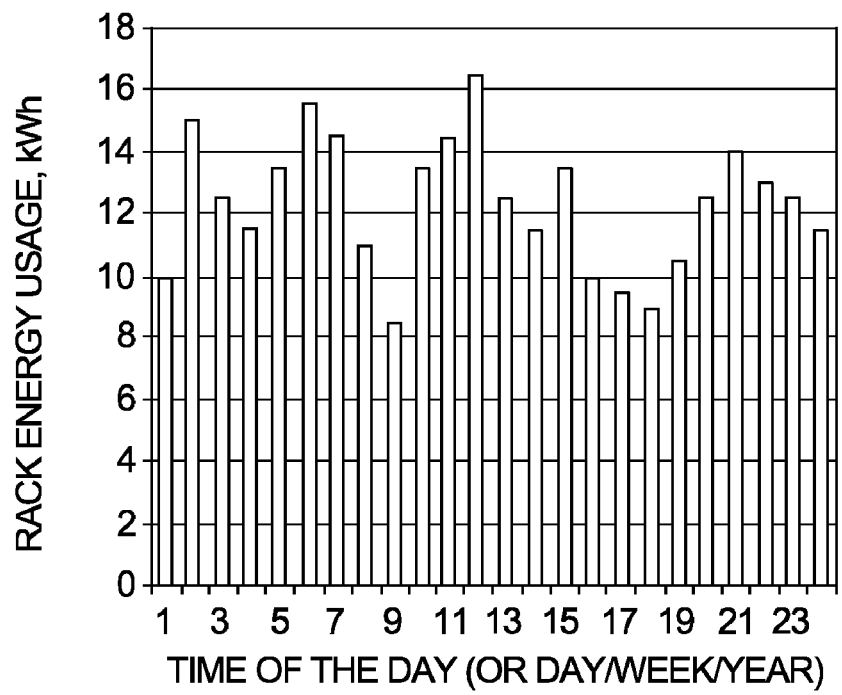
FIGS. 8A-8D depict exemplary output graphs of rack energy usage, zonal energy usage, CRAC energy usage, and coefficient of performance of a data center plotted, by way of example, against time of day, in accordance with an aspect of the present invention.
Figure 8B:
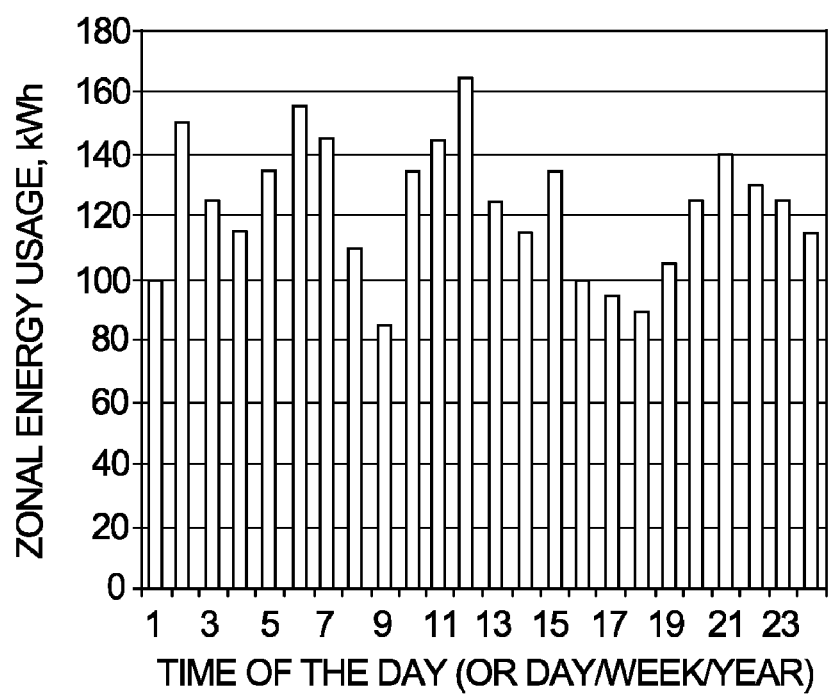
Figure 8C:
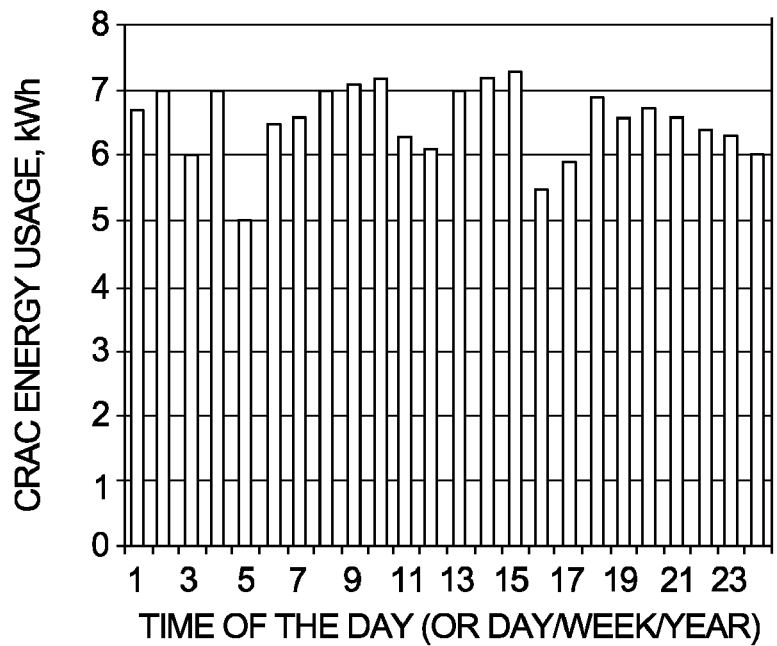
Figure 8D:
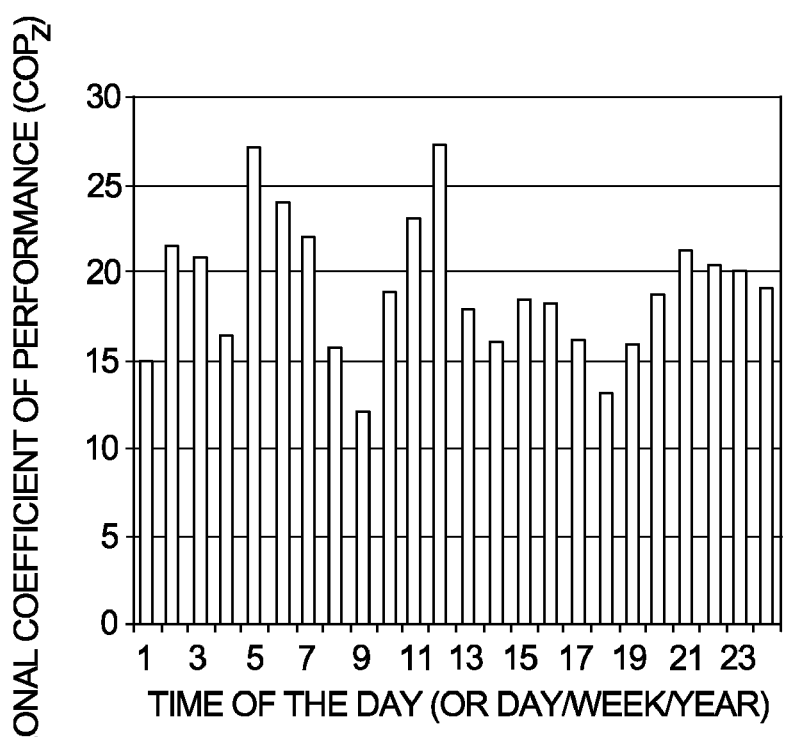

FIGS. 8A-8D depicts examples of historical energy usage and coefficient of performance data which may be output (for example, visually displayed or recorded) for an operator of the data center. In FIG. 8A, electronics rack level energy use is illustrated at different times of day (or alternatively, as a function of different days, different weeks or different years). In FIG. 8B, zonal energy usage is depicted as a function of time of day (or alternatively, as a function of the day of the week, week of the year or on a yearly basis). FIG. 8C plots CRAC unit energy usage versus time of day (or alternatively, versus day of the week, week of the year, or on a yearly basis). FIG. 8D graphically depicts one example of zonal coefficient of performance ($COP_Z$) plotted as a function of time of day (or alternatively, as a function of day of the week, week of the year, or on a yearly basis).

Figure 9A:
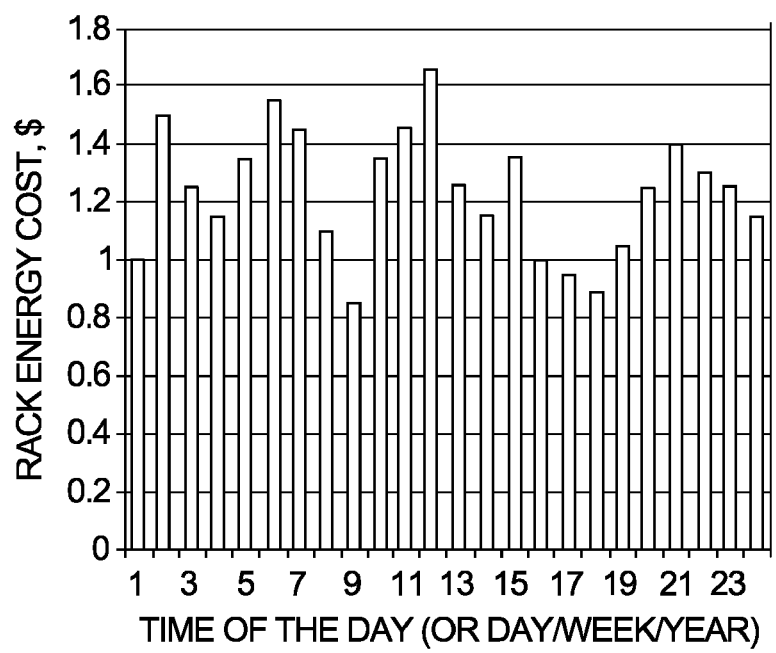
FIGS. 9A-9C illustrate exemplary output graphs of rack energy cost, zonal energy cost, and CRAC energy cost plotted, by way of example, against time of day, in accordance with an aspect of the present invention.
Figure 9B:
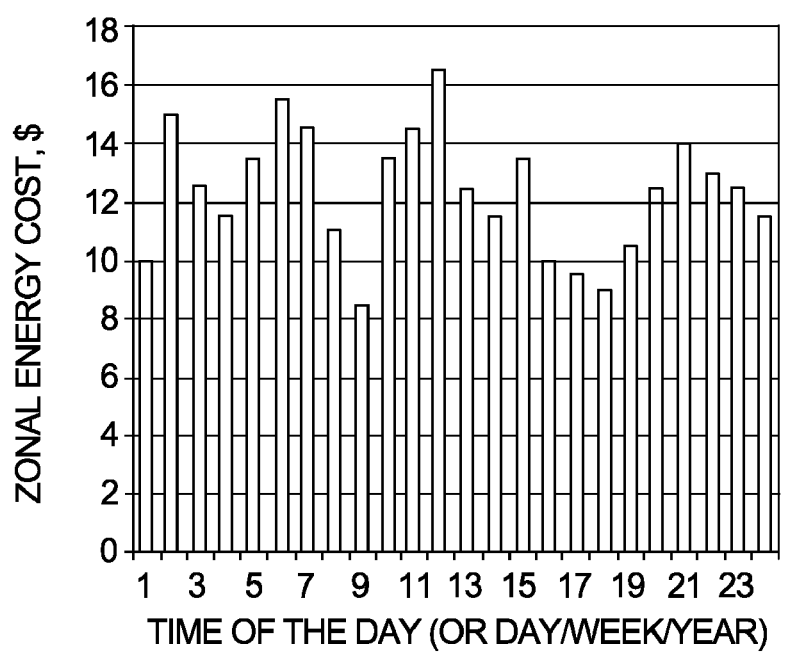
Figure 9C:
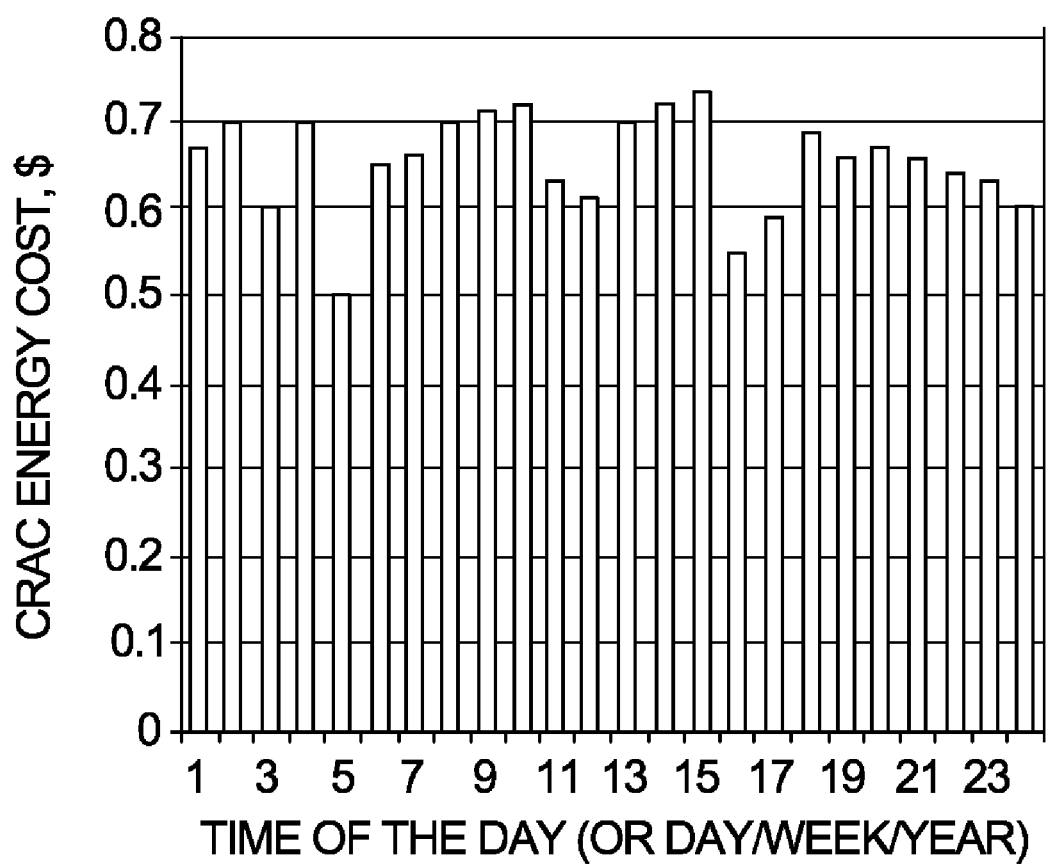

FIGS. 9A-9C illustrate further exemplary output graphs. In particular, the graphs illustrate rack energy cost, zone energy cost and CRAC energy cost, respectively, plotted by way of example, against time of day (or alternatively, day of week, week of year, or on a yearly basis).

Figure 10:
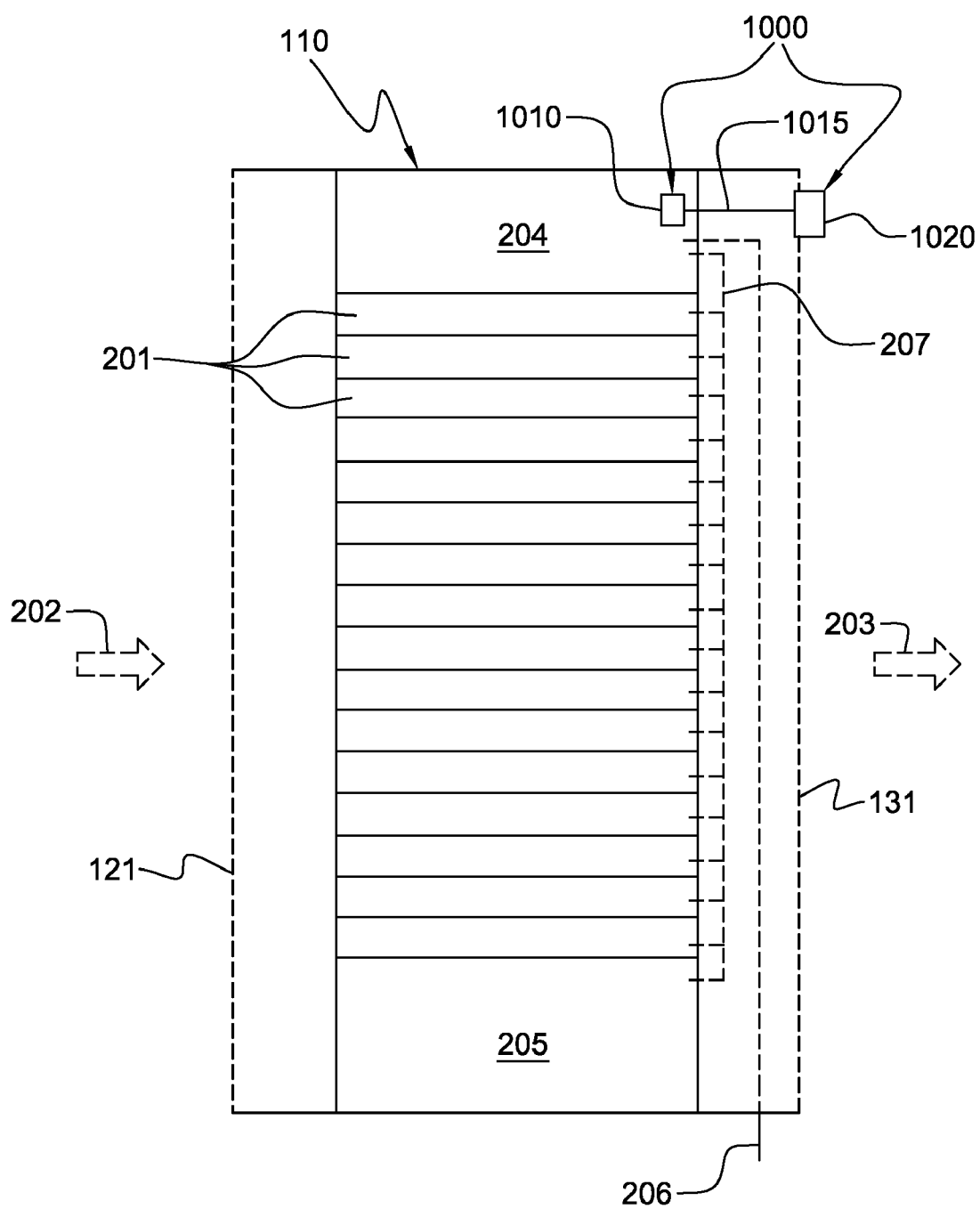
FIG. 10 is a cross-sectional view of an alternate embodiment of an electronics rack and a rack energy usage monitoring system, in accordance with an aspect of the present invention.

FIG. 10 depicts an alternate embodiment of an electronics rack 110 and rack energy usage monitoring system 1000, in accordance with an aspect of the present invention. Similar to the embodiment of FIG. 2, electronics rack 110 includes a plurality of electronics subsystems 201, as well as a rack power supply 204 and switch network 205. A power supply cable 206 provides AC power to rack power supply 204, which transforms the AC power into appropriate DC level voltages that are provided via distribution cable(s) 207 to the plurality of electronics subsystems 201 and switch network 205. The electronics components are cooled via cold air 202 ingressing through louvered air inlet door 121, which exhausts as hot air 203 through louvered air outlet door 131.

In this alternate embodiment, rack energy usage monitoring system 1000 includes a rack level hub 1010 and a rack monitor unit 1020 coupled via a data cable 1015. The rack level hub 1010 may be employed in place of the power measurement instrumentation of the rack energy usage monitoring system of FIG. 2. Employing rack level hub 1010, information collected by the electronics rack itself is accessed. Code can be assembled by one skilled in the art for accomplishing this function. For example, a LINUX operating system with Java C++ code may be employed. As one example, an IBM p-575 High Performance Computing (HPC) electronics rack includes a rack level hub, referred to as a Bulk Power Hub. TCP/IP protocol may be used to communicate over the system's internal network and the existing underlying power command subsystem within the P-575 HPC rack may be used as the mechanism to collect power/thermal data on the rack. An appropriately constructed power command is issued to the power subsystem, processed and the requested data is returned to the control unit. Both sides of the system can be available/accessible through a single data cable 1015, such as an Ethernet connector (e.g., an RJ 45 connector).

Operationally, when the electronics rack boots up, power is supplied to the control unit, causing it to boot up. The control unit connects to the internal network once it becomes available. After the connection has been established, power commands are issued to the power subsystem to determine the type and configuration of the electronics system within the rack. Once the configuration has been determined, the control unit begins to monitor/measure the power and thermal data points based on user configuration. This data is collected through the use of existing power commands within the system. In one embodiment, the control unit is configurable by a user. For example, it can allow identification of the electronics subsystems to be monitored, the refresh interval, alarm levels (triggered by power and/or by thermal threshold), and the data points to be reported. The user can be presented with applicable power/thermal options available for the electronics rack being monitored.

In an alternate implementation, the IBM Power Executive™ program may be used to obtain rack power information, for example, for an electronics rack employing one or more IBM Blade Center Systems. Also, in one implementation, the rack monitor unit could be a touch screen or have function buttons to allow for the retrieval of detailed power data.

The detailed description presented above is discussed in part in terms of procedures which may be executed on a computer, a network or a cluster of computers. These procedural descriptions and representations are used by those skilled in the art to most effectively convey the substance of their work to others skilled in the art. They may be implemented in hardware or software, or a combination of the two A procedure is here, and generally, conceived to be a sequence of steps leading to a desired result. These steps are those requiring physical manipulations of physical quantities. Usually, though not necessarily, these quantities take the form of electrical or magnetic signals capable of being stored, transferred, combined, compared, and otherwise manipulated. It proves convenient at times, principally for reasons of common usage, to refer to these signals as bits, values, elements, symbols, characters, terms, numbers, objects, attributes or the like. It should be noted, however, that all of these and similar terms are to be associated with the appropriate physical quantities and are merely convenient labels applied to these quantities.

Further, the manipulations performed are often referred to in terms, such as adding or comparing, which are commonly associated with mental operations performed by a human operator. No such capability of a human operator is necessary, or desirable in most cases, in any of the operations described herein which form part of the present invention; various operations described herein may be automatic machine operations. Useful machines for performing the operations of the present invention include general purpose digital computers or similar devices.

Selected steps of the method may be executed on a general computer, such as a mainframe computer, personal computer or the like and pursuant to one or more, or a part of one or more, program modules or objects generated from any programming language, such as C++, Java, Fortran or the like. And still further, a step, or a file or object or the like implementing a step, may be executed by special purpose hardware or a circuit module designed for that purpose.

Aspects of the invention are implemented (in one example) in a high level procedural or object-oriented programming language to communicate with a computer. However, the inventive aspects can be implemented in assembly or machine language, if desired. In any case, the language may be a compiled or interpreted language.

The invention may be implemented as a mechanism or a computer program product comprising a recording medium. Such a mechanism or computer program product may include, but is not limited to CD-ROMs, diskettes, tapes, hard drives, computer RAM or ROM and/or the electronic, magnetic, optical, biological or other similar embodiment of the program. Indeed, the mechanism or computer program product may include any solid or fluid transmission medium, magnetic or optical, or the like, for storing or transmitting signals readable by a machine for controlling the operation of a general or special purpose programmable computer according to the method of the invention.

Aspects of the invention may also be implemented in a system. A system may comprise a computer that includes a processor and a memory device and optionally, a storage device, an output device such as a video display and/or an input device such as a keyboard or computer mouse. Moreover, a system may comprise an interconnected network of computers. Computers may equally be in stand-alone form (such as the traditional desktop personal computer) or integrated into another environment (such as a partially clustered computing environment). The system may be specially constructed for the required purposes to perform, for example, the method steps of the invention or it may comprise one or more general purpose computers as selectively activated or reconfigured by a computer program in accordance with the teachings herein stored in the computer(s). The procedures presented herein are not inherently related to a particular computing environment. The required structure for a variety of these systems will appear from the description given.

Again, the capabilities of one or more aspects of the present invention can be implemented in software, firmware, hardware or some combination thereof.

One or more aspects of the present invention can be included in an article of manufacture (e.g., one or more computer program products) having, for instance, computer usable media. The media has therein, for instance, computer readable program code means or logic (e.g., instructions, code, commands, etc.) to provide and facilitate the capabilities of the present invention. The article of manufacture can be included as a part of a computer system or sold separately.

Additionally, at least one program storage device readable by a machine embodying at least one program of instructions executable by the machine to perform the capabilities of the present invention can be provided.

The flow diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. A method of facilitating monitoring a data center, the method comprising:

employing at least one rack monitor unit associated with at least one electronics rack in automatically determining energy usage of the at least one electronics rack of the data center, the automatically determining including automatically ascertaining an averaged, time-based energy usage of the at least one electronics rack, wherein the automatically ascertaining comprises obtaining multiple measurements of actual, instantaneous energy usage of the at least one electronics rack over a period of time, and averaging the multiple measurements to obtain the averaged, time-based energy usage of the at least one electronics rack;

employing at least one cooling monitor unit associated with at least one cooling unit of the data center in automatically determining energy usage of the at least one cooling unit, the automatically determining including automatically ascertaining an averaged, time-based energy usage of the at least one cooling unit over the same period of time as the averaged, time-based energy usage of the at least one electronics rack, wherein the automatically ascertaining comprises obtaining multiple measurements of actual, instantaneous energy usage of the at least one cooling unit over the period of time, and averaging the multiple measurements to obtain the averaged, time-based energy usage of the at least one cooling unit; and outputting the averaged, time-based energy usages of the at least one electronics rack and the at least one cooling unit to facilitate monitoring of the data center.

2. The method of claim 1, wherein the at least one cooling unit is at least one computer room air-conditioning unit of the data center.

3. The method of claim 2, further comprising employing the averaged, time-based energy usage of the at least one electronics rack in automatically determining a time-based cost of energy consumed by the at least one electronics rack, and employing the averaged, time-based energy usage of the at least one computer room air-conditioning unit in automatically determining a time-based cost of energy consumed by the at least one computer room air-conditioning unit.

4. The method of claim 2, wherein the averaged, time-based energy usage of the at least one electronics rack comprises hourly energy usage of the at least one electronics rack, and the averaged, time-based energy usage of the at least one computer room air-conditioning unit comprises hourly energy usage of the at least one computer room air-conditioning unit.

5. The method of claim 2, wherein the data center comprises:

a plurality of electronics racks, and
  wherein the automatically determining comprises automatically determining energy usage of each electronics rack of the plurality of electronics racks in the data center, the automatically determining including automatically ascertaining the averaged, time-based energy usage of each electronics rack over the same period of time, and
  wherein the automatically ascertaining includes obtaining multiple measurements of instantaneous energy usage of each electronics rack over the period of time, and averaging the multiple measurements for each electronics rack to obtain the averaged, time-based energy usage of each electronics rack of the plurality of electronics racks in the data center, and
  wherein the outputting comprises outputting the averaged, time-based energy usage of each electronics rack of the plurality of electronics racks to facilitate monitoring of the data center.

6. The method of claim 1, wherein the outputting comprises employing the at least one rack monitor unit associated with the at least one electronics rack in displaying the time-based energy usage of the at least one electronics rack.

7. The method of claim 1, wherein the data center comprises a plurality of electronics racks arranged in a plurality of zones, and wherein the method further comprises automatically determining zonal energy usage within at least one zone of the plurality of zones of the data center, the at least one zone comprising multiple electronics racks of the plurality of electronics racks, and wherein the automatically determining zonal energy usage comprises automatically ascertaining averaged, time-based energy usage of the multiple electronics racks in the at least one zone by obtaining multiple measurements of actual, instantaneous energy usage of the multiple electronics racks in the at least one zone over the period of time, and averaging the multiple measurements to obtain the averaged, time-based energy usage of the at least one zone, the averaged, time-based energy usage of the at least one zone being the zonal energy usage of the multiple electronics racks in the at least one zone, and the outputting comprises outputting zonal energy usage of the multiple electronics racks in the at least one zone to facilitate monitoring of the data center.

8. The method of claim 7, wherein the at least one zone of the data center further comprises the at least one cooling unit, and the at least one cooling unit is at least one computer room air-conditioning unit, and wherein the method further comprises automatically determining energy usage of the at least one computer room air-conditioning unit in the at least one zone, the automatically determining energy usage of the at least one computer room air-conditioning unit within the at least one zone comprising automatically obtaining the averaged, time-based energy usage of the at least one computer room air-conditioning unit within the at least one zone, and the outputting further comprises outputting zonal energy usage of the at least one computer room air-conditioning unit in the at least one zone to facilitate monitoring of the data center.

9. The method of claim 8, further comprising employing the averaged, time-based energy usage of the multiple electronics racks in the at least one zone in automatically determining a time-based cost of energy consumed by the multiple electronics racks in the at least one zone, and employing the averaged, time-based energy usage of the at least one computer room air-conditioning unit in the at least one zone in automatically determining a time-based cost of energy consumed by the at least one computer room air-conditioning unit in the at least one zone.

10. The method of claim 9, further comprising:
automatically determining cooling energy efficiency of the at least one zone expressed as a coefficient of performance, the coefficient of performance being determined as a ratio of the averaged, time-based energy usage of the multiple electronics racks in the at least one zone to the averaged, time-based energy usage of the at least one computer room air-conditioning unit in the at least one zone, and
automatically determining a time-based, total energy usage of the at least one zone by summing the averaged, time-based energy usage of the multiple electronics racks in the at least one zone and the averaged, time-based energy usage of the at least one computer room air-conditioning unit in the at least one zone, and
automatically determining a time-based, total cost of energy consumed within the at least one zone by automatically summing the time-based cost of energy consumed by the multiple electronics racks in the at least one zone and the time-based cost of energy consumed by the at least one computer room air-conditioning unit in the at least one zone, and
wherein the outputting further comprises outputting the cooling energy efficiency of the at least one zone, the time-based, total energy usage of the at least one zone, and the time-based, total cost of energy consumed within the at least one zone.

11. The method of claim 1, wherein the data center comprises a plurality of electronics racks and at least one computer room air-conditioning unit, and wherein the method further comprises:
automatically determining energy usage characteristics of the data center, the energy usage characteristics comprising:
time-based energy usage of the plurality of electronics racks within the data center;
time-based cost of the energy consumed by the plurality of electronics racks in the data center;
time-based energy usage of the at least one computer room air-conditioning unit in the data center;
time-based cost of energy consumed by the at least one computer room air-conditioning unit in the data center;
data center cooling energy efficient expressed as a coefficient of performance defined by the ratio of time-based energy usage of the plurality of electronics racks in the data center to time-based energy usage of the at least one computer room air-conditioning unit in the data center;
total time-based energy usage within the data center;
total time-based cost of energy consumed within the data center over the period of time; and
wherein the outputting comprises automatically outputting the energy usage characteristics to facilitate monitoring of the data center.

12. A system for monitoring a data center, the system comprising:
at least one rack monitor unit associated with at least one electronics rack of the data center for monitoring energy use thereof;
at least one instantaneous rack power measurement component associated with the at least one electronics rack of the data center, each instantaneous rack power measurement component of the at least one instantaneous rack power measurement component being coupled to a respective rack monitor unit of the at least one rack monitor unit;
wherein the at least one rack monitor unit automatically determines energy usage of the associated at least one electronics rack by automatically ascertaining an averaged, time-based energy usage of the at least one electronics rack employing the at least one instantaneous rack power measurement component, the automatically ascertaining including obtaining multiple measurements of actual, instantaneous energy usage of the associated at least one electronics rack over a period of time, and averaging the multiple measurements to obtain the averaged, time-based energy usage of the associated at least one electronics rack, and wherein the at least one rack monitor unit outputs the time-based energy usage of the associated at least one electronics rack to facilitate monitoring of the data center; and
wherein the data center comprises at least one cooling unit, and the system further comprises at least one cooling monitor unit associated with the at least one cooling unit of the data center for monitoring energy usage thereof, and at least one instantaneous cooling power measurement component associated with the at least one cooling unit of the data center, each instantaneous cooling power measurement component being coupled to a respective cooling monitor unit of the at least one cooling monitor unit, and wherein the at least one cooling monitor unit automatically determines energy usage of the associated at least one cooling unit by automatically obtaining averaged, time-based energy usage of the at least one cooling unit employing the at least one instantaneous cooling power measurement component, the automatically obtaining including obtaining multiple measurements of actual, instantaneous energy usage of the at least one cooling unit over the period of time and averaging the multiple measurements for the at least one cooling unit to obtain the averaged, time-based energy usage of the at least one cooling unit, and wherein the at least one cooling monitor unit outputs the averaged, time-based energy usage of the associated at least one cooling unit to facilitate monitoring of the data center.

13. The system of claim 12, wherein the at least one cooling unit is at least one computer room air-conditioning unit of the data center.

14. The system of claim 13, wherein the at least one rack monitor unit employs the averaged, time-based energy usage of the at least one electronics rack in automatically determining a time-based cost of energy consumed by the at least one electronics rack, and the at least one cooling monitor unit employs the averaged, time-based energy usage of the at least one computer room air-conditioning unit in automatically determining a time-based cost of energy consumed by the at least one computer room air-conditioning unit, and wherein the at least one rack monitor unit outputs the time-based cost of energy consumed by the at least one electronics rack, and the at least one cooling monitor unit outputs the time-based cost of energy consumed by the at least one computer room air-conditioning unit.

15. The system of claim 12, wherein the data center comprises:
- a plurality of electronics racks, and
- wherein the system further comprises at least one zonal monitor unit associated with multiple electronics racks of the plurality of electronics racks, and multiple instantaneous rack power measurement components associated with the multiple electronics racks of the plurality of electronics racks of the data center, each instantaneous rack power measurement component being coupled to the at least one zonal monitor unit, and
- wherein the at least one zonal monitor unit automatically determines zonal energy usage within at least one zone of the data center, the at least one zone comprising the multiple electronics racks of the plurality of electronics racks, and the automatically determining zonal energy usage comprises automatically ascertaining averaged, time-based energy usage of the multiple electronics racks in the at least one zone over the save time period, and
- outputting the zonal energy usage of the multiple electronics racks in the at least one zone to facilitate monitoring of the data center.

16. The system of claim 12, wherein the data center comprises a plurality of electronics racks and at least one computer room air-conditioning unit, and wherein the system further comprises a data center monitor unit, a plurality of rack monitor units associated with the plurality of electronics, racks of the data center for monitoring energy usage thereof, and at least one air-conditioning monitor unit associated with the at least one computer room air-conditioning monitoring unit for monitoring energy usage thereof, the plurality of rack monitor units and the at least one air-conditioning unit being coupled to the data center monitor unit for automatically determining energy usage characteristics of the data center, the energy usage characteristics comprising:
- time-based energy usage of the plurality of electronics racks within the data center;
- time-based cost of the energy consumed by the plurality of electronics racks in the data center;
- time-based energy usage of the at least one computer room air-conditioning unit in the data center;
- time-based cost of energy consumed by the at least one computer room air-conditioning unit in the data center;
- data center cooling energy efficient expressed as a coefficient of performance defined by the ratio of time-based energy usage of the plurality of electronics racks in the data center to time-based energy usage of the at least one computer room air-conditioning unit in the data center;
- total time-based energy usage within the data center;
- total time-based cost of energy consumed within the data center over the period of time; and
- wherein the outputting comprises automatically outputting the energy usage characteristics to facilitate monitoring of the data center.

17. A data center comprising:
- at least one electronics rack; and
- a system for monitoring energy usage of the at least one electronics rack, said system comprising:
    - at least one rack monitor unit associated with the at least one electronics rack for monitoring energy usage thereof;
    - at least one instantaneous rack power measurement component associated with the at least one electronics rack of the data center, each instantaneous rack power measurement component of the at least one instantaneous rack power measurement component being coupled to a respective rack monitor unit of the at least one rack monitor unit;
    - wherein the at least one rack monitor unit automatically determines energy usage of the associated at least one electronics rack by automatically ascertaining an averaged, time-based energy usage of the at least one electronics rack employing the at least one instantaneous rack power measurement component, the automatically ascertaining including obtaining multiple measurements of actual, instantaneous energy usage of the associated at least one electronics rack over a period of time, and averaging the multiple measurements to obtain the averaged time-based energy usage of the associated at least one electronics rack, and wherein the at least one rack monitor unit outputs the time-based energy usage of the associated at least one electronics rack to facilitate monitoring of the data center; and
    - wherein the data center comprises at least one cooling unit, and the system further comprises at least one cooling monitor unit associated with the at least one cooling unit of the data center for monitoring energy usage thereof, and at least one instantaneous cooling power measurement component associated with the at least one cooling unit of the data center, each instantaneous cooling power measurement component being coupled to a respective cooling monitor unit of the at least one cooling monitor unit, and wherein the at least one cooling monitor unit automatically determines energy usage of the associated at least one cooling unit by automatically obtaining averaged, time-based energy usage of the at least one cooling unit employing the at least one instantaneous cooling power measurement component, the automatically obtaining including obtaining multiple measurements of actual, instantaneous energy usage of the at least one cooling unit over the period of time and averaging the multiple measurements for the at least one cooling unit to obtain the averaged, time-based energy usage of the at least one cooling unit, and wherein the at least one cooling monitor unit outputs the averaged, time-based energy usage of the associated at least one cooling unit to facilitate monitoring of the data center.

18. The data center of claim 17, wherein the at least one cooling unit is at least one computer room air-conditioning unit of the data center.

19. The data center of claim 18, wherein the at least one rack monitor unit employs the averaged, time-based energy usage of the at least one electronics rack in automatically determining a time-based cost of energy consumed by the at least one electronics rack, and the at least one cooling monitor unit employs the averaged, time-based energy usage of the at least one computer room air-conditioning unit in automatically determining a time-based cost of energy consumed by the at least one computer room cooling unit, and wherein the at least one rack monitor unit outputs the time-based cost of energy consumed by the at least one electronics rack, and the at least one air-conditioning monitor unit outputs the time-based cost of energy consumed by the at least one computer room air-conditioning unit.

20. The data center of claim 17, wherein the data center further comprises:
   a plurality of electronics racks,
   at least one zonal monitor unit associated with multiple electronics racks of the plurality of electronics racks, and
   multiple instantaneous rack power measurement components associated with the multiple electronics racks of the plurality of electronics racks of the data center, each instantaneous rack power measurement component being coupled to the at least one zonal monitor unit, and
wherein the at least one zonal monitor unit automatically determines zonal energy usage within at least one zone of the data center, the at least one zone comprising the multiple electronics racks of the plurality of electronics racks, and the automatically determining zonal energy usage comprises:
   automatically ascertaining averaged, time-based energy usage of the multiple electronics racks in the at least one zone over the same time period, and
   outputting the zonal energy usage of the multiple electronics racks in the at least one zone to facilitate monitoring of the data center.

* * * * *